(12) United States Patent
Oda et al.

(10) Patent No.: US 10,070,541 B2
(45) Date of Patent: Sep. 4, 2018

(54) DISPLAY DEVICE AND METHOD OF ASSEMBLING IT

(71) Applicant: ALPINE ELECTRONICS, INC., Tokyo (JP)

(72) Inventors: Kazuki Oda, Iwaki (JP); Shinobu Kida, Iwaki (JP)

(73) Assignee: Alpine Electronics, Inc., Tokyo (JP)

( * ) Notice: Subject to any disclaimer, the term of this patent is extended or adjusted under 35 U.S.C. 154(b) by 0 days.

(21) Appl. No.: 15/689,750

(22) Filed: Aug. 29, 2017

(65) Prior Publication Data

US 2018/0110138 A1   Apr. 19, 2018

(30) Foreign Application Priority Data

Oct. 18, 2016   (JP) ................. 2016-204243

(51) Int. Cl.
| | |
|---|---|
| H05K 5/00 | (2006.01) |
| H05K 5/02 | (2006.01) |
| H01J 17/49 | (2012.01) |
| G02F 1/1333 | (2006.01) |
| G06F 1/16 | (2006.01) |

(52) U.S. Cl.
CPC ......... *H05K 5/0017* (2013.01); *H05K 5/0247* (2013.01); *G02F 1/133308* (2013.01); *G02F 2001/133314* (2013.01); *G06F 1/1601* (2013.01); *H01J 17/49* (2013.01); *H05K 5/02* (2013.01)

(58) Field of Classification Search
CPC ..... H05K 5/0017; H05K 5/0247; H01J 17/49; G06F 1/1601; G02F 1/133308; G02F 2001/133314
See application file for complete search history.

(56) References Cited

U.S. PATENT DOCUMENTS

| | | | | |
|---|---|---|---|---|
| 5,119,204 A | * | 6/1992 | Hashimoto | H04N 5/64 348/794 |
| 6,256,075 B1 | * | 7/2001 | Yang | G06F 1/1601 312/7.2 |
| 7,259,958 B2 | * | 8/2007 | Bang | H05K 5/0204 248/220.21 |

(Continued)

FOREIGN PATENT DOCUMENTS

JP   2008-256771   10/2008

OTHER PUBLICATIONS

Extended European Search Report for related Application No. 17196603.9-1221, dated Mar. 19, 2018 (7 pgs).

*Primary Examiner* — Dimary Lopez Cruz
*Assistant Examiner* — Abhishek Rathod
(74) *Attorney, Agent, or Firm* — Brinks Gilson & Lione

(57) ABSTRACT

A display device includes a display module, a rear cover that covers the rear surface of the display module, a main circuit board placed in an internal space formed between the rear cover and the rear surface of the display module, flexible wiring members that mutually connects the display module and the main circuit board, and a male screw having a head exposed to the outside of the rear cover, the male screw passing through the rear cover and engaging a female screw formed in the main circuit board. The main circuit board is fixed to the rear cover with the male screw in a state in which the main circuit board is not fixed to the display module.

5 Claims, 10 Drawing Sheets

(56) References Cited

U.S. PATENT DOCUMENTS

| | | | |
|---|---|---|---|
| 7,796,378 B2* | 9/2010 | Jang | F16M 11/041 |
| | | | 174/393 |
| 7,828,616 B2* | 11/2010 | Kim | G02F 1/133308 |
| | | | 361/638 |
| 8,154,864 B1 | 4/2012 | Nearman et al. | |
| 2001/0034211 A1* | 10/2001 | Kuroshima | H01H 13/705 |
| | | | 455/575.1 |
| 2006/0160387 A1* | 7/2006 | Kim | H05K 5/02 |
| | | | 439/160 |
| 2006/0192730 A1* | 8/2006 | Kim | H05K 5/02 |
| | | | 345/60 |
| 2007/0195494 A1 | 8/2007 | Miyoshi et al. | |
| 2008/0122739 A1* | 5/2008 | Kim | G06F 1/1601 |
| | | | 345/60 |
| 2011/0141671 A1* | 6/2011 | Ishizu | F16M 11/10 |
| | | | 361/679.01 |
| 2014/0104795 A1* | 4/2014 | Wee | H05K 7/14 |
| | | | 361/752 |
| 2014/0254192 A1* | 9/2014 | Do | G02B 6/0051 |
| | | | 362/606 |
| 2016/0026029 A1 | 1/2016 | Kawada | |
| 2016/0033996 A1* | 2/2016 | Lee | G06F 1/1626 |
| | | | 361/679.26 |
| 2016/0295710 A1* | 10/2016 | Ueyama | B60R 11/0229 |

* cited by examiner

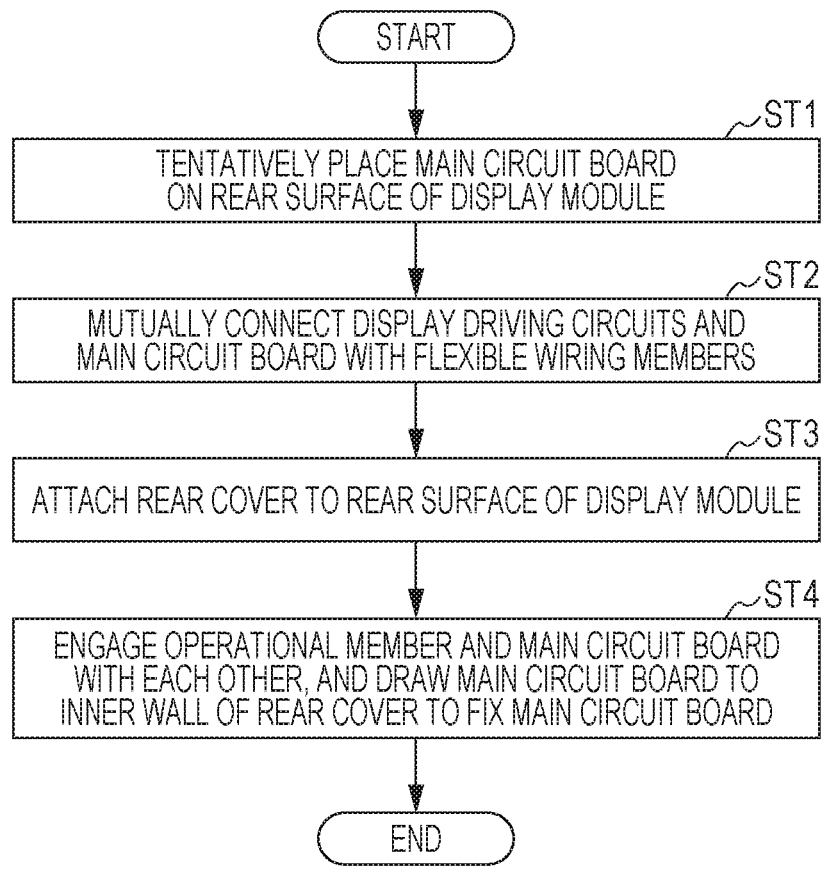

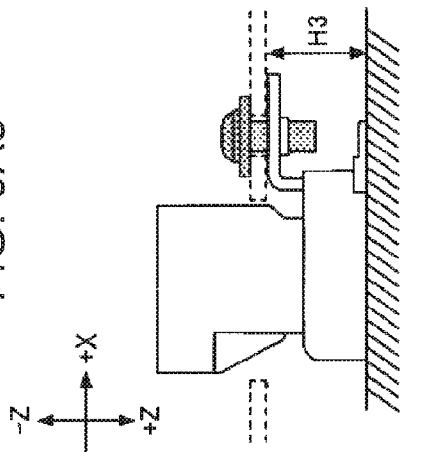
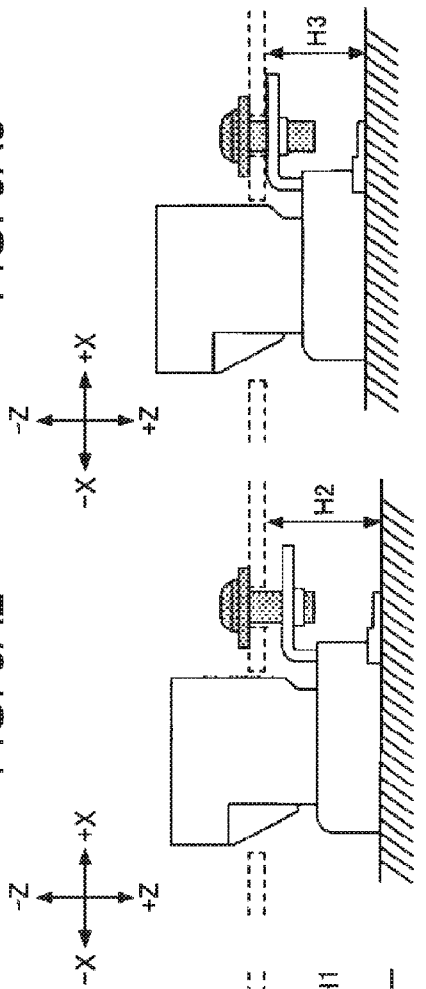
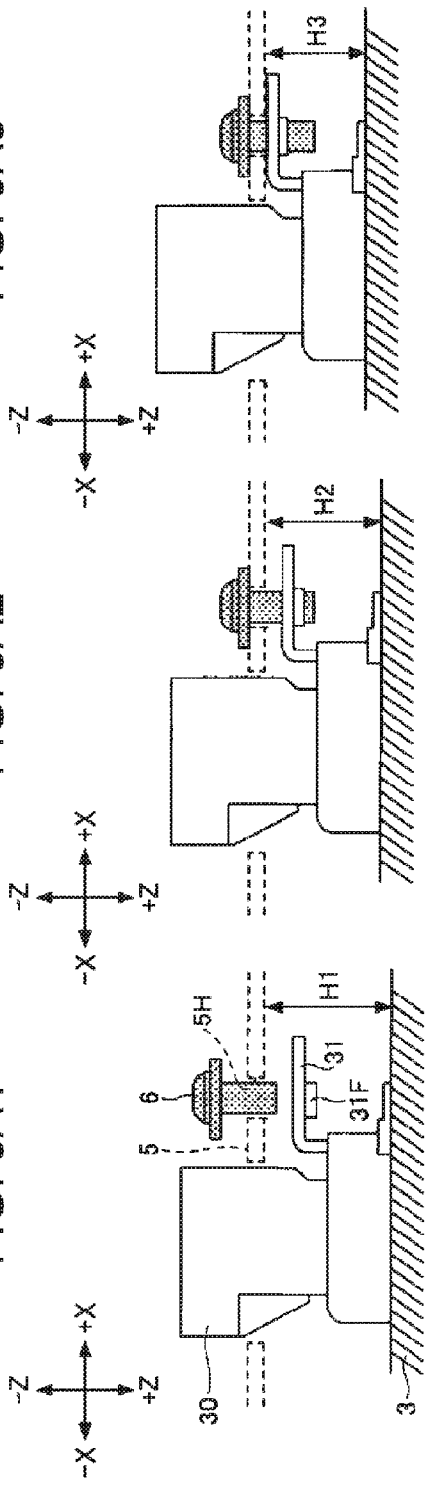
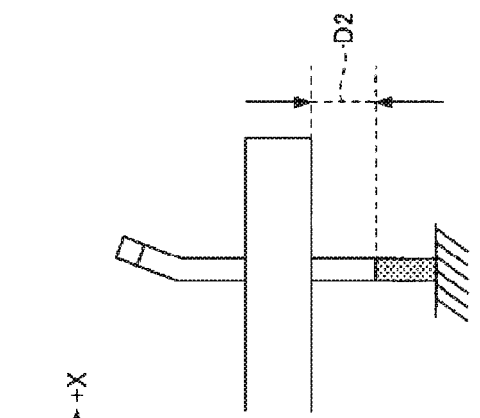
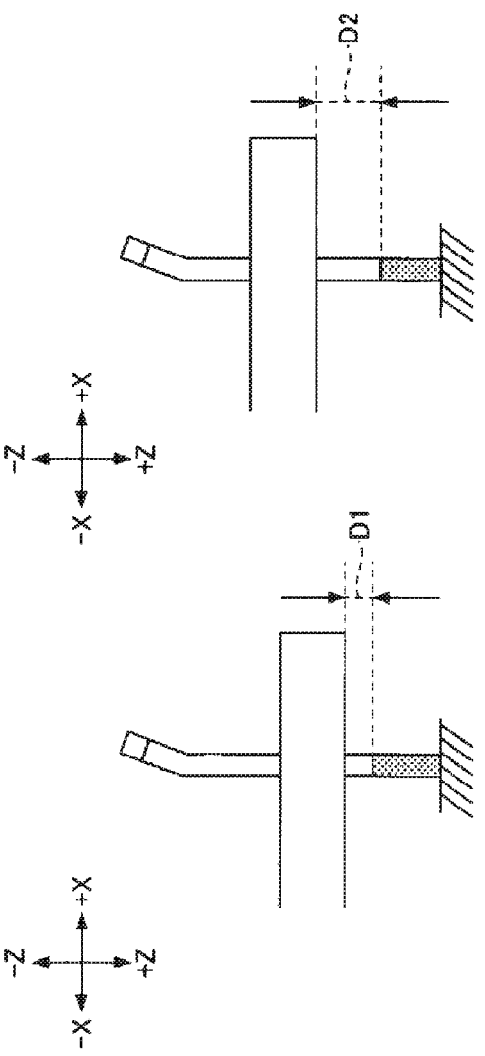
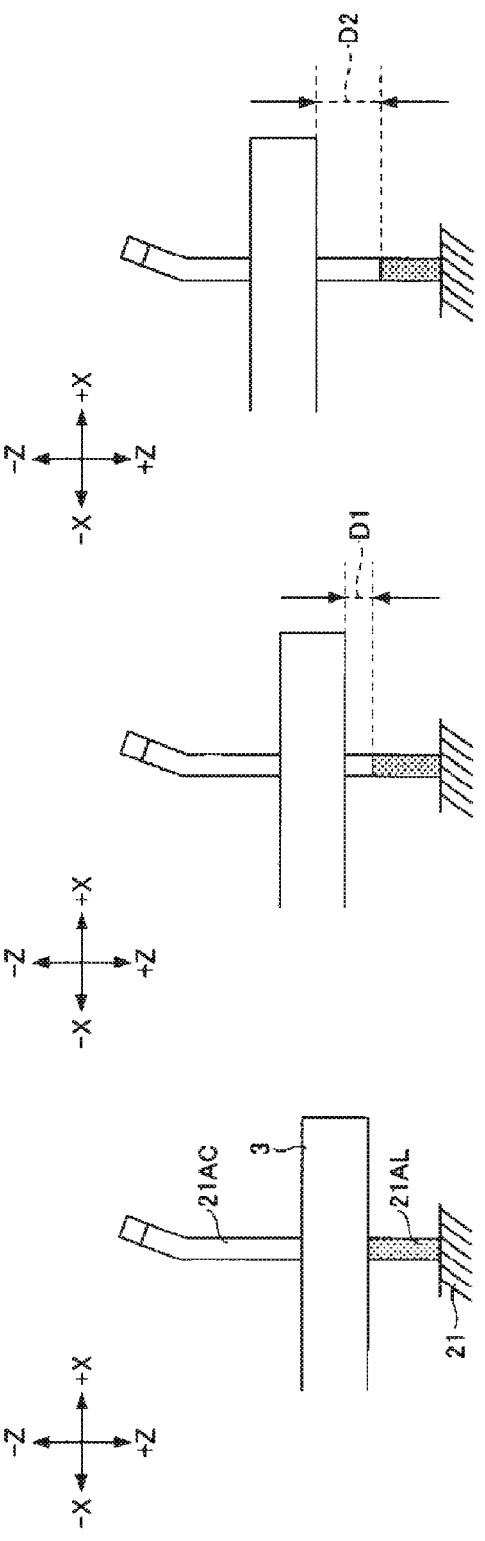

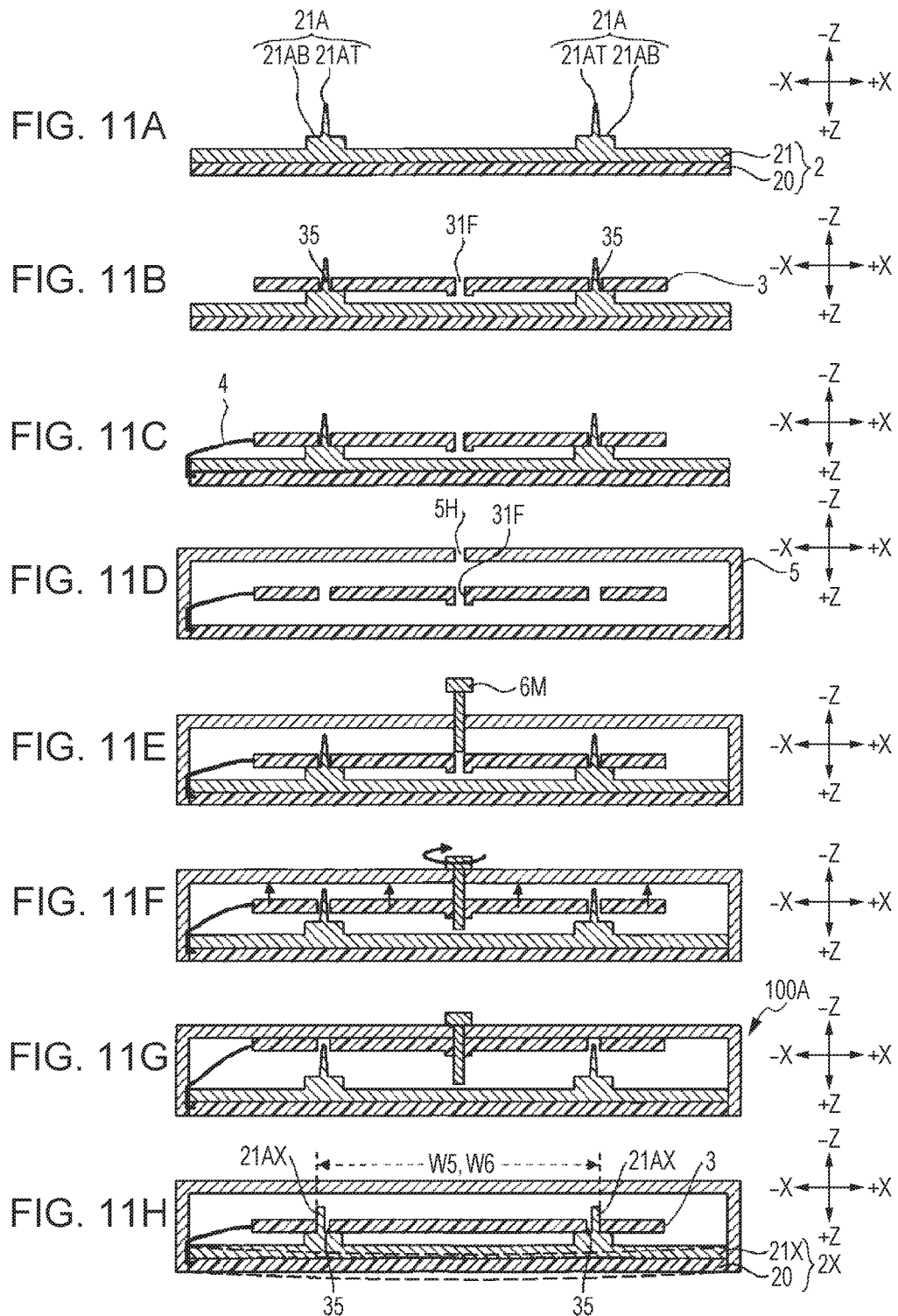

DISPLAY DEVICE AND METHOD OF ASSEMBLING IT

RELATED APPLICATION

The application claims priority to Japanese Patent Application Number 2016-204243, filed Oct. 18, 2016, the entirety of which is hereby incorporated by reference.

BACKGROUND

1. Field

The present disclosure relates to a display device and a method of assembling it.

2. Description of the Related Art

A conventional plasma display device known in the related art includes a chassis member bonded to the rear surface of a plasma display panel and also includes a holding plate on which an address driver circuit and other driving circuit portions are mounted (see Japanese Unexamined Patent Application Publication No. 2008-256771). To fix the holding plate to the rear surface of the chassis member, two elastic boss portions provided on the chassis member are inserted into two openings formed in the holding plate while the elastic boss portions are deformed so as to be contracted. The holding plate is also fixed by being held by two clips made of an elastic metal plate, the clips being attached to the chassis member.

SUMMARY

When the holding plate is combined with the chassis member as described above, a bending load exerted on the plasma display panel may be generated. If, for example, a spacing between the two elastic boss portions is smaller than a spacing between the two openings due to, for example, manufacturing error, a bending load is generated that tends to cause the rear surface of the chassis member to warp. This is also true when two clips are used to fix two opposing sides of the holding plate. This type of bending load generated due to a relationship in which constituent elements are combined causes the plasma display panel bonded to the chassis member to be distorted or warped, for example, resulting in Black Mura and other failures.

A possible solution to this type of problem is to fix the holding plate to the inner surface of a rear cover or the like instead of the chassis member, and to use screws or the like that are manipulated from the inside as fixing means. However, the plasma display panel and holding plate are often mutually connected with a flexible printed circuit (FPC) or the like. After they have been mutually connected, an assembling operation becomes very difficult. If a plurality of FPCs are used or a short FPC is used, an assembling operation is almost impossible.

In view of this, there is a demand for a display device in which a force given to a display panel by a holding plate or another circuit board can be further reduced, and that can be easily assembled.

A display device in an embodiment of the present disclosure includes a display module, a cover that covers the rear surface of the display module, a main circuit board placed in an internal space formed between the cover and the rear surface of the display module, flexible wiring members that mutually connect the display module and the main circuit board, and an operational member having an operational part exposed to the outside of the cover, the operational member passing through the cover and engaging an engagement part provided at the main circuit board. The main circuit board is fixed to the cover by the operational member in a state in which the main circuit board is not fixed to the display module.

A method of assembling the display device in an embodiment of the present disclosure includes a step of tentatively placing the main circuit board on the rear surface of the display module, a step of mutually connecting the display module and the main circuit board with the flexible wiring members, a step of attaching the cover to the rear surface of the display module, and a step of drawing the main circuit board toward the cover by using the operational member and fixing the main circuit board.

Due to the means described above, it is possible to provide a display device in which a force given to a display panel by a circuit board can be further reduced and that can be easily assembled, and to provide a method of assembling the display device.

BRIEF DESCRIPTION OF THE DRAWINGS

FIG. 3 is a flowchart illustrating a method of assembling the display device;

FIGS. 9A1 to 9A3 and 9B1 to 9B3 are drawings illustrating the motion of the main circuit board during the forward turn of the male screw;

FIGS. 11A to 11G are drawings related to a display device in another embodiment of the present disclosure, while FIG. 11H illustrates a comparative example.

DESCRIPTION OF THE PREFERRED EMBODIMENTS

Figure 1A:
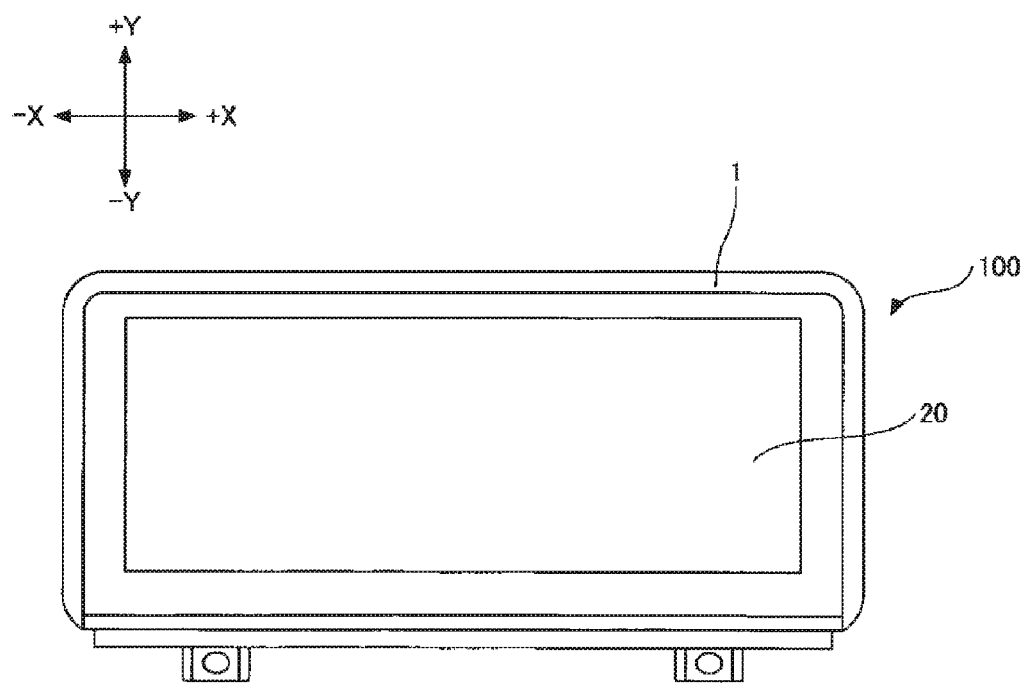
FIGS. 1A and 1B are schematic drawings illustrating a display device in an embodiment of the present disclosure.
Figure 1B:
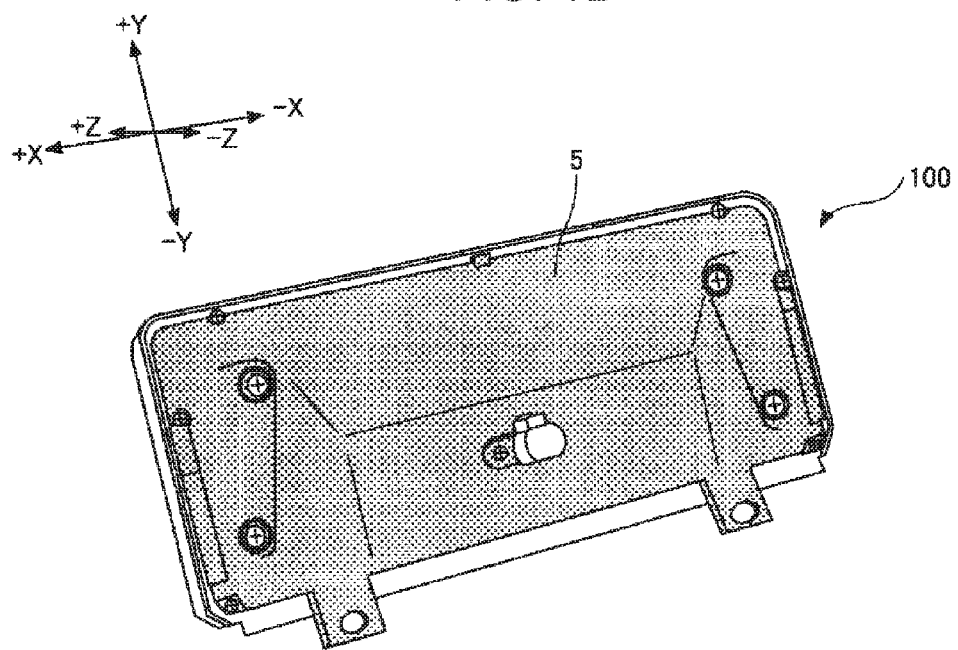
Figure 2:
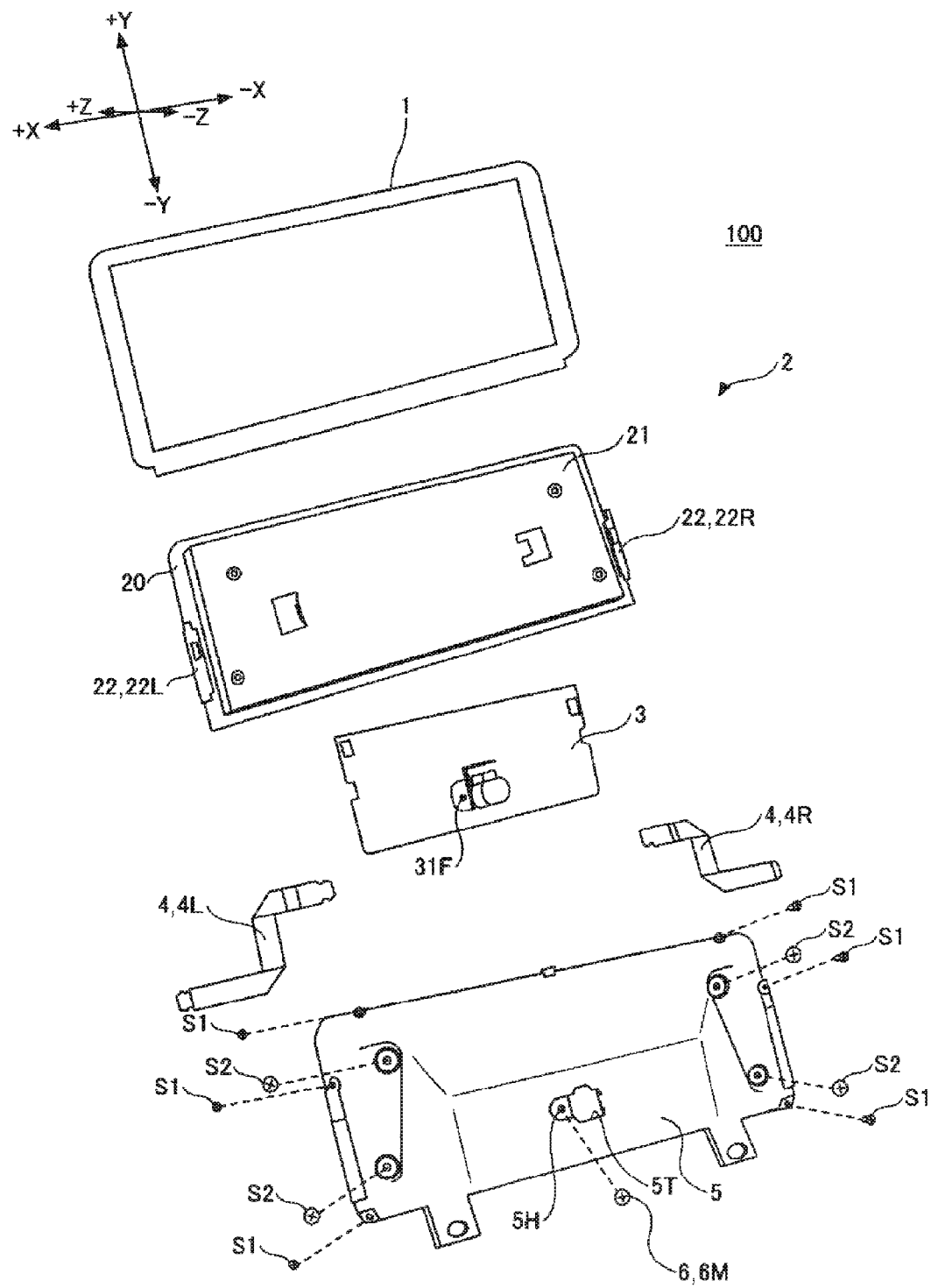
FIG. 2 is an exploded perspective view of the display device in FIGS. 1A and 1B.

FIGS. 1A and 1B are schematic drawings illustrating a display device 100 in an embodiment of the present disclosure. Specifically, FIG. 1A is a front view of the display device 100, and FIG. 1B is a perspective view of the rear surface of the display device 100. FIG. 2 is an exploded perspective view of the rear surface of the display device 100. For convenience of explanation in this description, the front side of the display device 100 will be taken as the +Z side and the rear side will be taken as the −Z side. The upper side, lower side, right side, and left side when the front of the display device 100 is viewed from the +Z side will be respectively taken as the +Y side, −Y side, +X side, and −X side.

The display device 100 is, for example, a liquid crystal display device. However, the display device 100 may be another type of display device such as a plasma display device or an organic electroluminescent (EL) display device. As illustrated in FIG. 2, the display device 100 includes a front frame body 1, a display module 2, a main circuit board 3, flexible wiring members 4, a rear cover 5, an operational member 6, and the like.

The front frame body 1, which is a member formed like a picture frame, is placed so as to enclose the circumference of the front side (+Z side) of the display module 2. In this embodiment, the front frame body 1 is attached to the rear cover 5 with six screws S1.

The display module 2 is a main part of the display device 100. In this embodiment, the display module 2 includes a display panel 20, a back plate 21, display driving circuits 22, and the like. The rear cover 5 is attached to the display module 2 with four screws S2.

The display panel 20 is a plate-like part forming the front surface (surface on the +Z side) of the display module 2. In this embodiment, the display panel 20 is a liquid crystal panel. A touch panel may be attached at the front of the display panel 20.

The back plate 21 is a plate-like part forming the rear surface (surface on the −Z side) of the display module 2. In this embodiment, the back plate 21 is a backlight.

Each display driving circuit 22 supplies an electric signal to the display panel 20. In this embodiment, the display driving circuits 22 are attached at both the right end (on the +X side) and the left end (on the −X side) of the display panel 20. Part or all of the display driving circuits 22 may be integrated into at least one of the display panel 20 and back plate 21.

The main circuit board 3 is a display driving circuit board that supplies an image signal and driving electric power to the display driving circuits 22. In this embodiment, the main circuit board 3 is a printed circuit board placed on the rear side (−Z side) of the back plate 21.

Each flexible wiring member 4 mutually connects the display module 2 and main circuit board 3. In this embodiment, the flexible wiring members 4, each of which is a flexible cable, include flexible wiring members 4L and 4R. The flexible wiring member 4L electrically connects a display driving circuit 22L, which is attached to the left side (+X side) of the display panel 20, and the main circuit board 3 to each other. The flexible wiring member 4R electrically connects a display driving circuit 22R, which is attached to the right side (−X side) of the display panel 20, and the main circuit board 3 to each other. Each flexible wiring member 4 may mutually connect the main circuit board 3 and back plate 21.

The rear cover 5 is a member placed so as to cover the display module 2 and main circuit board 3, which have been mutually connected with the flexible wiring members 4, from the rear side. In this embodiment, the rear cover 5 is made of a metal and forms a ground electrode.

The operational member 6 is operable by a worker. In this embodiment, the operational member 6 is a male screw 6M having a cross recess in the top surface of an octagon head. The head, which is an operational part, is exposed to the outside of the rear cover 5. The worker operates the male screw 6M by using a Phillips screwdriver or the like. However, the head of the male screw 6M may have another shape, and a groove, a recess, or the like formed in the top surface of the head may also have another shape. A tool used to operate the male screw 6M is changed according to the shape of the male screw 6M and the like.

The operational member 6 passes through the rear cover 5, engages the main circuit board 3, draws the main circuit board 3 toward the rear cover 5, and fixes the main circuit board 3. In the example in FIG. 2, the male screw 6M extends so as to pass through a through-hole 5H in the rear cover 5 and engages a female screw 31F formed in the main circuit board 3. When the male screw 6M is turned in a forward direction (in the clockwise direction, for example) from the outside of the rear cover 5 by using a Phillips screwdriver or the like, the male screw 6M draws the main circuit board 3 toward the inner surface (surface on the −Z side) of the rear cover 5. At a point in time before the male screw 6M engages the female screw 31F, the main circuit board 3 is just tentatively placed on the rear surface (surface on the −Z side) of the back plate 21, so the main circuit board 3 can move in a direction in which the male screw 6M extends (in the −Z direction). The male screw 6M draws the main circuit board 3 until it comes into contact with the inner wall of the rear cover 5, after which the male screw 6M fastens the main circuit board 3 to the rear cover 5 to fix the main circuit board 3.

In the tentative placement, the main circuit board 3 is placed on the rear surface of the display module 2 in a state in which the movement of the main circuit board 3 is restricted along the rear surface (XY plane) of the display module 2. In this embodiment, the main circuit board 3 is tentatively placed on the rear surface of the display module 2 in a state in which translational movement in the X-axis direction and Y-axis direction is restricted and rotation around the three axes area also restricted. However, translational movement in the Z-axis direction is allowed. That is, the movement of the main circuit board 3 is restricted in directions other than a direction in which the main circuit board 3 moves toward the rear cover 5. However, the main circuit board 3 may be tentatively placed in another restricted state. For example, the main circuit board 3 may be tentatively placed in a state in which translational movement is restricted only in any one of the X-axis direction and Y-axis direction. Constituent elements that enable tentative placement will be described later in detail.

Next, a method of assembling the display device 100 will be described with reference to FIG. 3. FIG. 3 is a flowchart illustrating a method of assembling the display device 100.

First, the worker tentatively places the main circuit board 3 on the rear surface of the display module 2 (step ST1).

Figure 4A:
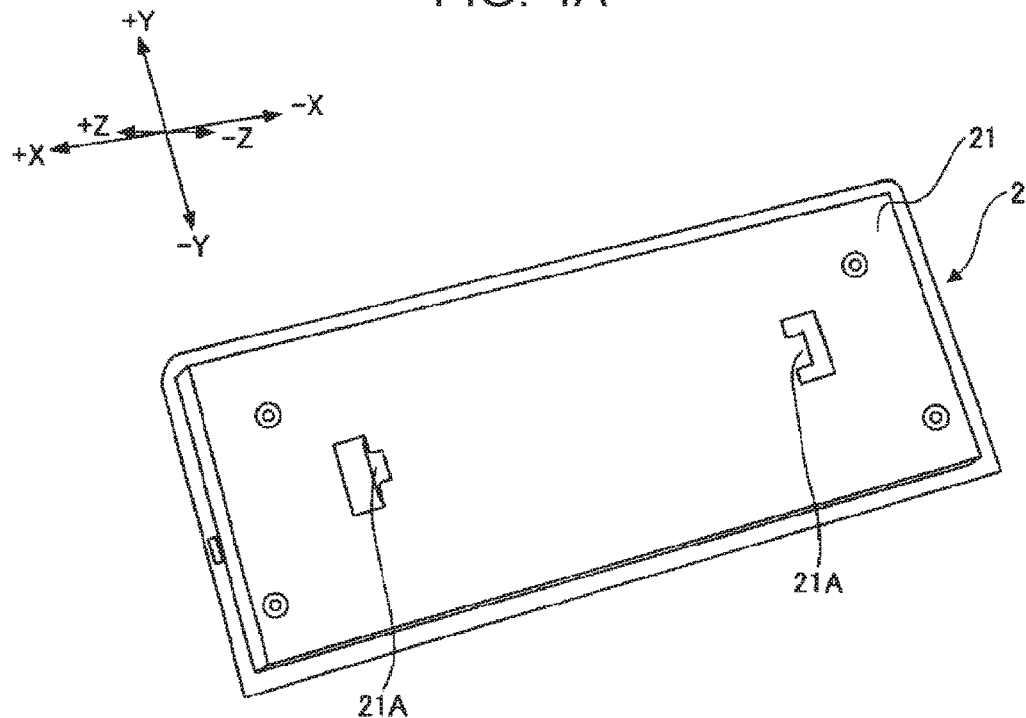
FIGS. 4A to 4C are drawings related to a display module.
Figure 4B:
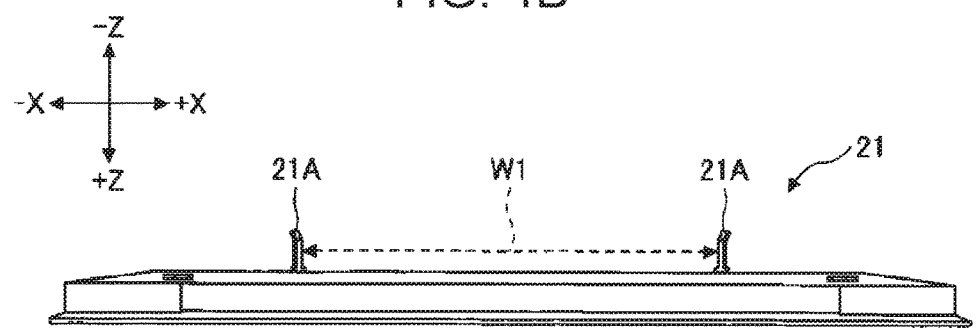
Figure 4C:
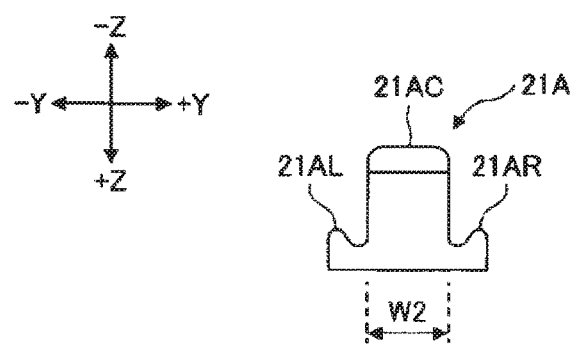
Figure 5B:
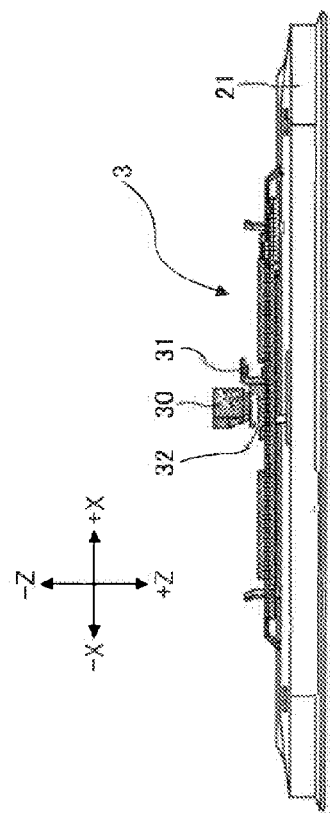
FIGS. 5A to 5D are drawings related to a main circuit board that has been tentatively placed on the rear surface of the display module.
Figure 5A:
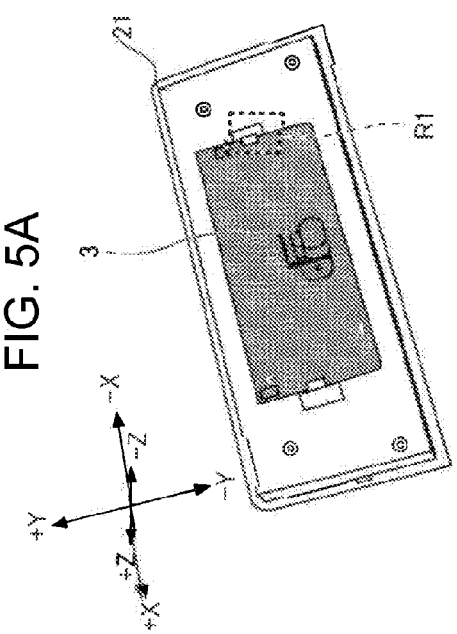
Figure 5D:
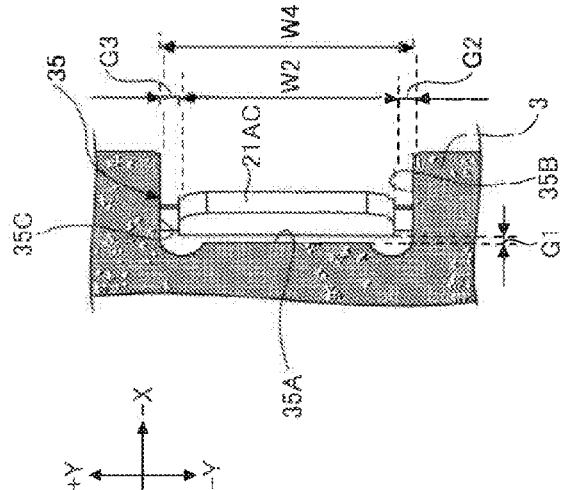
Figure 5C:
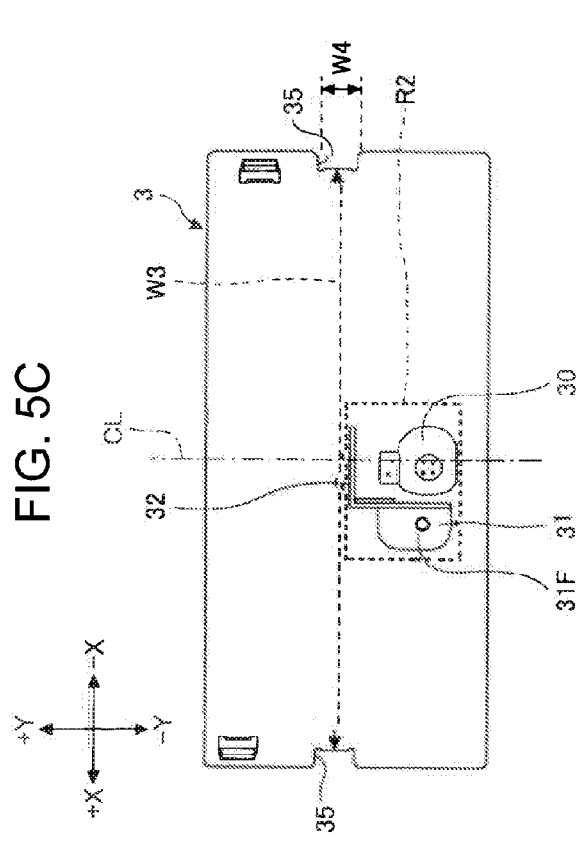

Now, tentative placement in step ST1 will be described with reference to FIGS. 4A to 4C and FIGS. 5A to 5D. FIGS. 4A to 4C are drawings related to the display module 2. Specifically, FIG. 4A is a perspective view of the rear surface, FIG. 4B is a side view as viewed from the −Y side, and FIG. 4C is a side view of a tentative placement structural part 21A as viewed from the −X side. FIGS. 5A to 5D are drawings related to the main circuit board 3 tentatively placed on the rear surface of the display module 2. Specifically, FIG. 5A is a perspective view of the rear surface, FIG. 5B is a side view as viewed from the −Y side, FIG. 5C is a plan view of the main circuit board 3 as viewed from the −Z side, and FIG. 5D is an enlarged view of a region R1 in FIG. 5A as viewed from the −Z side. In FIGS. 5A, 5B, and 5D, the main circuit board 3, which has been attached anew, is grayed.

Specifically, the worker places the display module 2 on the surface of a flat workbench so that the front surface (surface on the +Z side) of the display module 2 faces downward, as illustrated in FIG. 4B.

After that, the worker tentatively places the main circuit board 3 on the rear surface of the display module 2 so that notches 35 (see FIG. 5C) formed in the main circuit board 3 are aligned with the tentative placement structural parts 21A (see FIG. 4B) of the display module 2.

Each tentative placement structural part 21A is a member that extends in the −Z direction from the rear surface (surface on the −Z side) of the back plate 21. In this embodiment, two tentative placement structural parts 21A are formed with a spacing W1 left between them in the X axis direction. Each tentative placement structural part 21A is formed integrally with the back plate 21 by bending part of the rear surface of the back plate 21. As illustrated in FIG. 4C, the tentative placement structural part 21A has a central guide part 21AC having a width W2 in the Y-axis direction, and also has a first support 21AL and a second support 21AR, which are placed on both sides of the central guide part 21AC. The central guide part 21AC extends farther in the −Z direction than the first support 21AL and second support 21AR.

As illustrated in FIG. 5C, two notches 35 are formed at both the right end and left end (on the +X side and −X side) of the main circuit board 3, one at each end, with a spacing W3 left between them in the X-axis direction. Each notch 35 has a width W4 in the Y-axis direction. The spacing W3 is smaller than the spacing W1 between the tentative placement structural parts 21A, and the width W4 is larger the width W2 of the central guide part 21AC of the tentative placement structural part 21A.

With this structure, when the main circuit board 3 is tentatively placed on the rear surface of the display module 2, the main circuit board 3 is supported by the tentative placement structural parts 21A in a state in which the surface of the main circuit board 3 on the +Z side is in contact with the first supports 21AL and second supports 21AR. As illustrated in FIG. 5D, the main circuit board 3 can be supported without touching the central guide part 21AC. This state of the main circuit board 3 will be referred to as the positioned state. Specifically, at the notch 35 on the right side (−X side), a clearance G1 is formed between an end 35A of the main circuit board 3 and the end face of the central guide part 21AC on the +X side. Similarly, a clearance G2 is formed between an end 35B of the main circuit board 3 and the end face of eth central guide part 21AC on the −Y side, and a clearance G3 is formed between an end 35C of the main circuit board 3 and the end face of the central guide part 21AC on the +Y side.

In other words, in the −X direction, the main circuit board 3 in the positioned state illustrated in FIG. 5D can move by a distance equivalent to the clearance G1 but a further movement is restricted by the central guide part 21AC. Similarly, in the +Y direction, the main circuit board 3 can move by a distance equivalent to the clearance G2 but a further movement is restricted by the central guide part 21AC; in the −Y direction, the main circuit board 3 can move by a distance equivalent to the clearance G3 but a further movement is restricted by the central guide part 21AC. In the −Z direction, however, the movement of the main circuit board 3 in the state illustrated in FIG. 5D is not restricted by the tentative placement structural part 21A.

In addition, the two tentative placement structural parts 21A and two notches 35 restrict the relative rotation of the main circuit board 3 with respect to the display module 2. In this regard, although two combinations of the tentative placement structural part 21A and notch 35 are formed in this embodiment, three or more combinations may be formed. In this embodiment, the two notches 35 are positioned so as to be symmetric with respect to the central line CL of the main circuit board 3 in its short-side direction (see FIG. 5C). However, the two notches 35 may be positioned so as to be asymmetric with respect to the central line CL. For example, one longer edge of the main circuit board 3 may have one notch 35 and one shorter edge may have one notch 35. Although, in this embodiment, the notches 35 are formed in outer edges of the main circuit board 3, the notches 35 may be formed in an inner area of the main circuit board 3 as through-holes. The number of combinations of the tentative placement structural part 21A and notch 35 may be 1. Alternatively, a combination of the tentative placement structural part 21A and notch 35 may be omitted.

As illustrated in FIGS. 5B and 5C, an interface 30, a bracket 31, and a guide 32 are attached to the surface of the main circuit board 3 on the −Z side. The bracket 31 and guide 32, which are typically made of a metal, are formed integrally with each other.

The interface 30 is a member that establishes a connection with an external device. In this embodiment, the interface 30 is a receptacle that, when the rear cover 5 is attached to the display module 2, passes through a through-hole 5T (see FIG. 2) formed in the rear cover 5 and extends in the −Z direction.

The bracket 31 is an example of an engaging part that cooperates with the operational member 6. In this embodiment, the bracket 31 is a member that has a female screw 31F, which mates with the male screw 6M, at the center of a plane plate parallel to the surface of the main circuit board 3.

The guide 32 is a member that guides the main circuit board 3, which is drawn toward the rear cover 5 by the male screw 6M. In this embodiment, the guide 32 is an L-shaped member that engages a positioning structural part provided on the inner wall of the rear cover 5. The positioning structural part will be described later in detail.

After the main circuit board 3 has been tentatively placed on the rear surface of the display module 2, the worker mutually connects the display driving circuits 22 and main circuit board 3 with the flexible wiring members 4 (step ST2 in FIG. 3).

Figure 6:
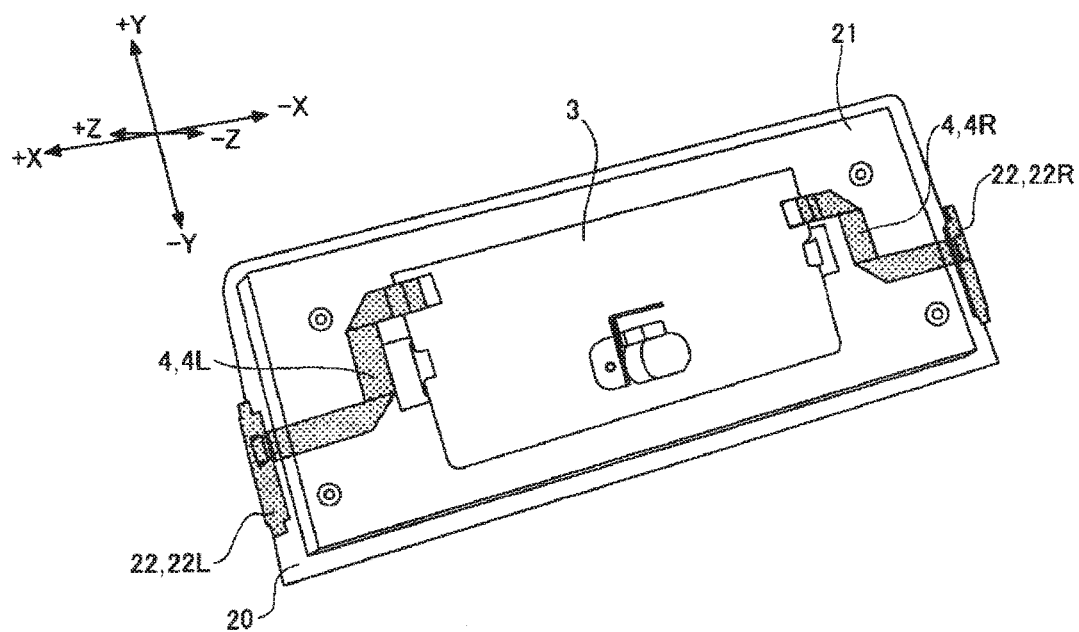
FIG. 6 is a perspective view of the rear surface of the display module to which the main circuit board, flexible wiring members, and a display driving circuit have been attached.

Now, connection in step ST2 will be described with reference to FIG. 6. FIG. 6 is a perspective view of the rear surface of the display module 2 to which the main circuit board 3, flexible wiring members 4, and display driving circuits 22 are attached. In FIG. 6, the flexible wiring members 4 and display driving circuits 22, which have been attached anew, are grayed.

Specifically, the worker attaches the display driving circuits 22 to the display panel 20 with the main circuit board 3 being tentatively placed on the rear surface of the display module 2, as illustrated in FIG. 6. The display driving circuits 22 may be attached to the display panel 20 before the main circuit board 3 is tentatively placed on the rear surface of the display module 2.

Then, the worker mutually connects the display driving circuit 22R and main circuit board 3 with the flexible wiring member 4R and also mutually connects the display driving circuit 22L and main circuit board 3 with the flexible wiring member 4L. Typically, after the flexible wiring members 4 have been connected to the display driving circuits 22, the flexible wiring members 4 are connected to the main circuit board 3. However, after the flexible wiring members 4 have been connected to the main circuit board 3, the flexible wiring members 4 may be connected to the display driving circuits 22. In this case, the flexible wiring members 4 may be connected to the main circuit board 3 before the main circuit board 3 is tentatively placed on the rear surface of the display module 2. Alternatively, the worker may first mutually connect the display driving circuits 22 and main circuit board 3 with the flexible wiring members 4, after which the worker may attach the display driving circuits 22 to the display panel 20.

When the worker connects the flexible wiring members 4 to the main circuit board 3 and display driving circuits 22, the main circuit board 3 receives an external force through the flexible wiring members 4. However, the movement of the main circuit board 3 is restricted by the tentative placement structural parts 21A along the rear surface (XY plane) of the display module 2. Therefore, even when the main circuit board 3 receives an external force through the flexible wiring members 4, the main circuit board 3 does not translationally move or rotate along the rear surface (XY plane) of the display module 2. This is also true when the main circuit board 3 is raised in the −Z direction by an external force through the flexible wiring members 4. This is because the central guide part 21AC of the tentative placement structural part 21A has a certain height. When the external force applied through the flexible wiring members 4 is removed, the main circuit board 3 raised in the −Z direction returns to its previous position at which the main circuit board 3 has been tentatively placed.

After having mutually connected the display driving circuits 22 and main circuit board 3 with the flexible wiring members 4, the worker attaches the rear cover 5 to the rear surface (surface on the −Z side) of the display module 2 (step ST3 in FIG. 3).

Figure 7:
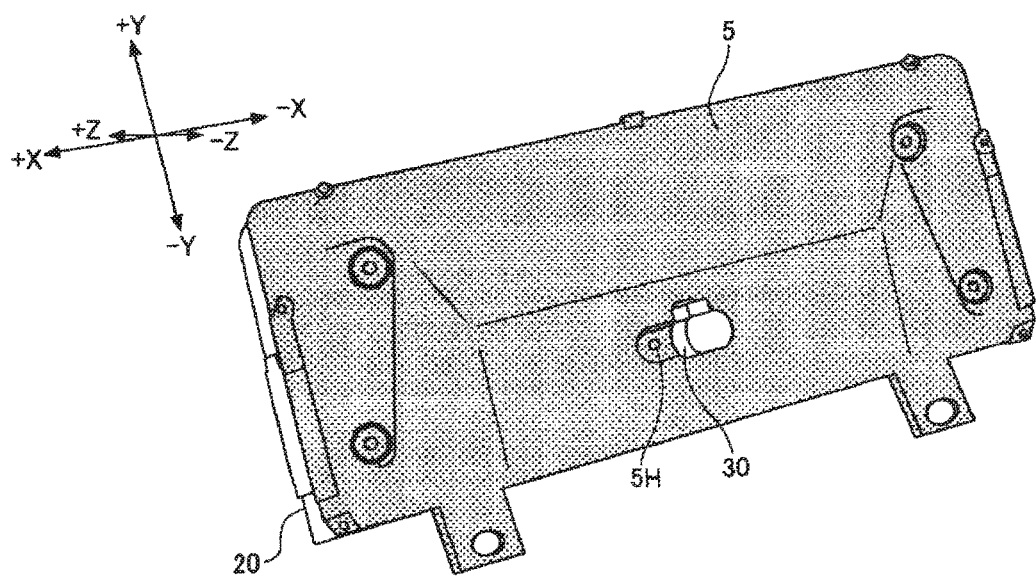
FIG. 7 is a perspective view of the rear surface of a rear cover attached to the display module.

Now, attachment of the rear cover 5 in step ST3 will be described with reference to FIG. 7. FIG. 7 is a perspective view of the rear surface of the rear cover 5 attached to the display module 2. In FIG. 7, the rear cover 5, which has been attached anew, is grayed.

Specifically, the worker attaches the rear cover 5 to the rear surface of the display module 2 so that the through-hole 5T (see FIG. 2) in the rear cover 5 and the interface 30 extending from the main circuit board 3 in the −Z direction match as illustrated in FIG. 7. In this step, the rear cover 5 may be attached to the display module 2 by using the screws S2 (see FIG. 2). Alternatively, the front frame body 1 may be attached to the rear cover 5 by using the screws S1 (see FIG. 2).

After having attached the rear cover 5 to the rear surface (surface on the −Z side) of the display module 2, the worker engages the operational member 6 and main circuit board 3 with each other and draws the main circuit board 3 toward the inner wall of the rear cover 5 and fixes the main circuit board 3 (step ST4 in FIG. 3).

Figure 8B:
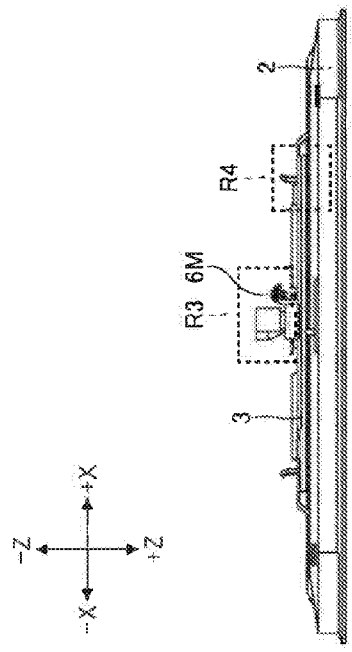
FIGS. 8A to 8D are drawings related to a male screw that draws the main circuit board toward the inner wall of the rear cover and fixes the main circuit board.
Figure 8D:
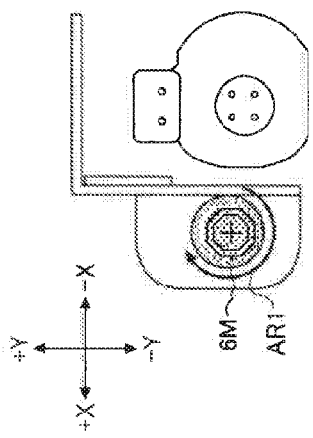
Figure 8A:
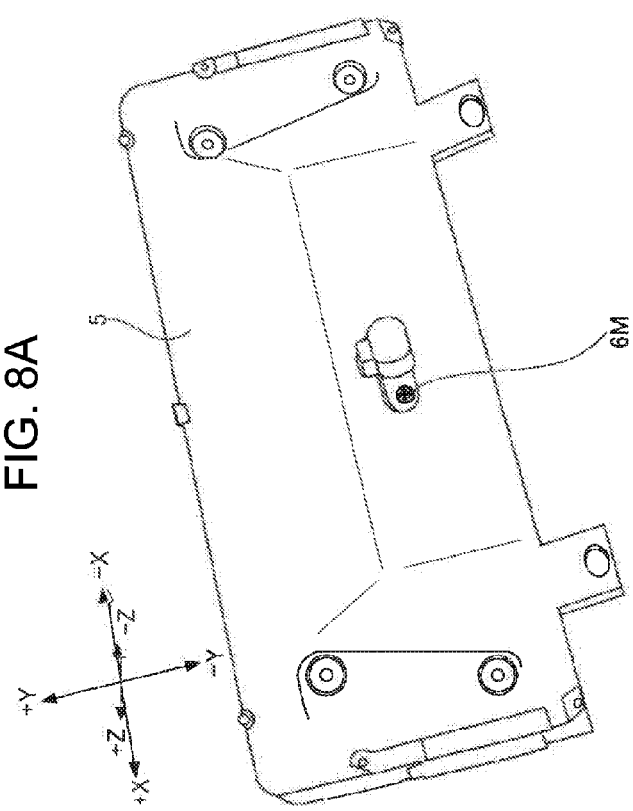
Figure 8C:
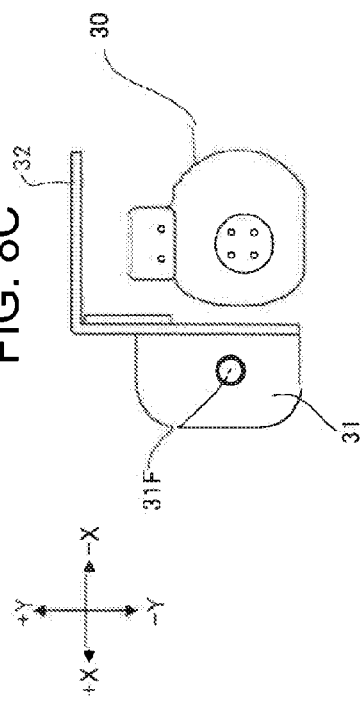

Now, the fixing of the main circuit board 3 to the rear cover 5 in step ST4 will be described with reference to FIGS. 8A to 8D. FIGS. 8A to 8D are drawings related to the male screw 6M that draws the main circuit board 3 toward the inner wall of the rear cover 5 and fixes the rear cover 5. Specifically, FIG. 8A is a perspective view of the rear surface of the rear cover 5 attached to the display module 2, illustrating a state in which the male screw 6M has been inserted into the through-hole 5H (see FIG. 7) of the rear cover 5. FIG. 8B is a side view of the display module 2 including the main circuit board 3 with which the male screw 6M is engaged, as viewed from the −Y side. FIGS. 8C and 8D are each an enlarged view of the area R2 in FIG. 5C; FIG. 8C illustrates a state before the male screw 6M is engaged, and FIG. 8D illustrates a state after the male screw 6M has been engaged. To simplify the internal structure, the rear cover 5 is not illustrated in FIGS. 8B to 8D. In FIGS. 8A, 8B, and 8D, the male screw 6M, which has been attached anew, is grayed.

Specifically, the worker inserts the male screw 6M into the through-hole 5H (see FIG. 7) in the rear cover 5 and engages the male screw 6M with the female screw 31F formed in the bracket 31 on the main circuit board 3, as illustrated in FIG. 8A. The main circuit board 3 is just tentatively placed on the display module 2, so the main circuit board 3 is not in contact with the central guide part 21AC of each tentative placement structural part 21A as illustrated in FIG. 5D.

Then, the worker turns the male screw 6M clockwise, as indicated by the arrow AR1 in FIG. 8D. As a result, the main circuit board 3, which is placed in a state in which it is movable in the −Z direction, is drawn toward the inner wall of the rear cover 5 until the bracket 31 comes into contact with the inner wall of the rear cover 5. When the worker further turns the male screw 6M clockwise with the bracket 31 in contact with the inner wall of the rear cover 5, the bracket 31 is fastened to the inner wall of the rear cover 5. As a result, the worker can fix the main circuit board 3 to the rear cover 5. When the bracket 31 is fastened to the inner wall of the rear cover 5, the main circuit board 3 is reliably grounded.

Now, the motion of the main circuit board 3 during the forward (clockwise, for example) turn of the male screw 6M will be described with reference to FIGS. 9A1 to 9A3 and 9B1 to 9B3. FIGS. 9A1 to 9A3 and 9B1 to 9B3 illustrate the motion of the main circuit board 3 during the clockwise turn of the male screw 6M. Specifically, FIGS. 9A1 to 9A3 are each an enlarged view of the area R3 in FIG. 8B, indicating the rear cover 5 with dotted lines. FIGS. 9B1 to 9B3 are each an enlarged view of the area R4 in FIG. 8B, indicating the rear cover 5 with dotted lines. FIGS. 9A1 and 9B1 illustrate a state before the male screw 6M is engaged with the female screw 31F. FIGS. 9A2 and 9B2 illustrate a state after the male screw 6M has been engaged with the female screw 31F and before the bracket 31 is fastened to the inner wall of the rear cover 5. FIGS. 9A3 and 9B3 illustrate a state after the bracket 31 has been fastened to the inner wall of the rear cover 5.

In the state before the male screw 6M is engaged with the female screw 31F, the height of an internal space, which is a spacing between the front surface (surface on the −Z side) of the main circuit board 3 and the inner wall surface (surface on the +Z side) of the rear cover 5, is a distance H1, as illustrated in FIG. 9A1. The rear surface (surface on the +Z side) of the main circuit board 3 comes in contact with the first support 21AL and second support 21AR (invisible in FIG. 9B1) and is supported by them, as illustrated in FIG. 9B1.

Then, when the male screw 6M is turned clockwise, the main circuit board 3 is drawn toward the rear cover 5 as illustrated in FIG. 9A2, reducing the height of the internal space to a distance H2, which is shorter than the distance H1. At the same time, the rear surface (surface on the +Z side) of the main circuit board 3 is raised from the first support 21AL and second support 21AR by a distance D1, as illustrated in FIG. 9B2.

Then, when the male screw 6M is further turned clockwise, the main circuit board 3 is fastened to the inner wall of the rear cover 5 with the bracket 31 intervening between them as illustrated in FIG. 9A3, fixing the main circuit board 3 to the rear cover 5. The height of the internal space is further reduced to a distance H3, which is shorter than the distance H2. At the same time, the rear surface (surface on the +Z side) of the main circuit board 3 is raised from the first support 21AL and second support 21AR by a distance D2, which is longer than the distance D1, and is maintained, as illustrated in FIG. 9B3. Even in this state, the rear surface (surface on the +Z side) of the main circuit board 3 is at a position lower than the height of the central guide part 21AC of the tentative placement structural part 21A. Therefore, the tentative placement structural part 21A can restrict the movement of the main circuit board 3 with respect to the display module 2 in the X-axis direction and Y-axis direction until the main circuit board 3 is fastened to the inner wall of the rear cover 5. However, when the main circuit board 3 is fastened to the inner wall of the rear cover 5, the rear surface (surface on the +Z side) of the main circuit board 3 may be at a position higher than the height of the central guide part 21AC.

Figure 10A:
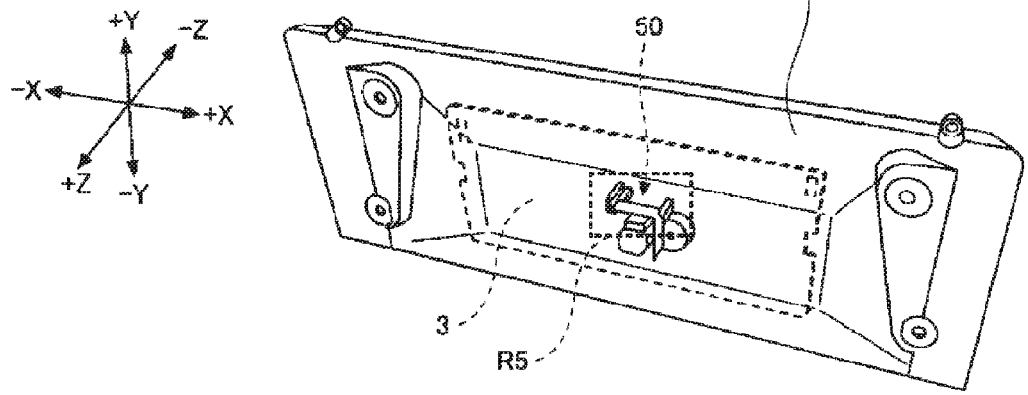
FIGS. 10A to 10C are drawings related to a positioning structural part.
Figure 10B:
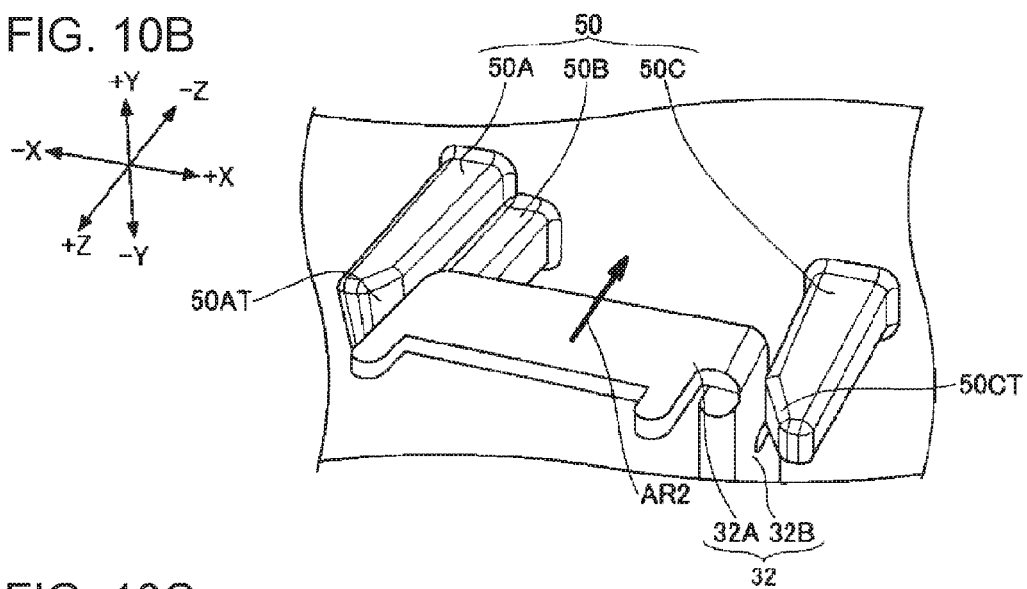
Figure 10C:
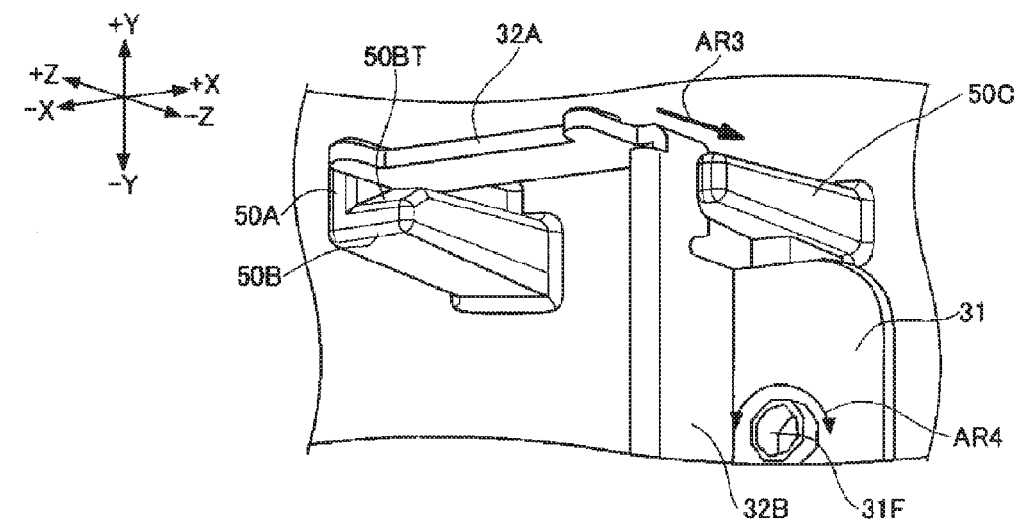

Next, a positioning structural part 50 formed on the inner wall of the rear cover 5 will be described with reference to FIGS. 10A to 10C. FIGS. 10A to 10C are drawings related to the positioning structural part 50. Specifically, FIG. 10A is a perspective view of the main circuit board 3 placed in an internal space enclosed by the display module 2 and rear cover 5, as viewed from the +Z side. In FIG. 10A, the main circuit board 3 is transparent so that the positioning structural part 50 becomes visible. FIG. 10B is an enlarged view of the area R5 in FIG. 10A. FIG. 10C is an enlarged view of the area R5 in FIG. 10A, as viewed from another angle. In FIGS. 10B and 10C, some members including the interface 30 are not illustrated for clarity.

As illustrated in FIGS. 10B and 10C, the positioning structural part 50 is structured so as to restrict the movement of the main circuit board 3 in directions other than a direction in which the main circuit board 3 moves toward the rear cover 5. When the main circuit board 3 is drawn toward the inner wall of the rear cover 5 by the male screw 6M, the positioning structural part 50 positions the main circuit board 3. While the main circuit board 3 is drawn toward the inner wall of the rear cover 5 by the male screw 6M, the guide 32 on the main circuit board 3 moves in directions indicated by the arrow AR2 in FIG. 10B and the arrow AR3 in FIG. 10C.

In this embodiment, the guide 32 formed in an L shape mainly includes a first guide 32A extending along the X axis and a second guide 32B extending along the Y axis. The positioning structural part 50 mainly includes a first structural part 50A, a second structural part 50B, and a third structural part 50C.

The first structural part 50A is placed so as to restrict the movement of the first guide 32A in the −X direction. Specifically, the first structural part 50A is placed so that when the main circuit board 3 moves in the −X direction, the end face of the first structural part 50A on the +X side and the end face of the first guide 32A on the −X side come into contact with each other.

The second structural part 50B is placed so as to restrict the movement of the first guide 32A in the −Y direction. Specifically, the second structural part 50B is placed so that when the main circuit board 3 moves in the −Y direction, the end face of the second structural part 50B on the +Y side and the end face of the first guide 32A on the −Y side come into contact with each other.

The third structural part 50C is placed so as to restrict the movement of the second guide 32B in the +X direction. Specifically, the third structural part 50C is placed so that when the main circuit board 3 moves in the +X direction, the end face of the third structural part 50C on the −X side and the end face of the second guide 32B on the +X side come into contact with each other.

The third structural part 50C is also placed so as to restrict the movement of the bracket 31 in the +Y direction. Specifically, the third structural part 50C is placed so that when the main circuit board 3 moves in the +Y direction, the end face of the third structural part 50C on the −Y side and the end face of the bracket 31 on the +Y side come into contact with each other.

The first structural part 50A, second structural part 50B, and third structural part 50C respectively have an inclined surface 50AT, an inclined surface 50BT, and an inclined surface 50CT at the end on the +Z side. Therefore, even if there is a slight positional deviation when the guide 32 and positioning structural part 50 are engaged with each other, these inclined surfaces enable the guide 32 to be guided to the position (orientation) indicated in FIGS. 10B and 10C.

With this structure, when the main circuit board 3 is drawn toward the inner wall of the rear cover 5 by turning the male screw 6M and is fastened to and fixed to the inner wall, the positioning structural part 50 can maintain the main circuit board 3 in a desired orientation with respect to the rear cover 5.

When the male screw 6M is turned as indicated by the arrow AR4 in FIG. 10C, this structure can also prevent the guide 32 from being turned in the direction in which the male screw 6M is turned. This is because the turn of the guide 32 is restricted by a contact between the positioning structural part 50 and the guide 32.

Although, in this embodiment, the first structural part 50A and second structural part 50B are formed integrally with each other, they may be formed separately. For example, the second structural part 50B may be placed independently at an intermediate point between the first structural part 50A and the third structural part 50C. Alternatively, any one of the first structural part 50A and second structural part 50B may be omitted. There are no restrictions on the positions, shapes, lengths and widths of these structural parts and on the number of these structural parts. Structural parts are appropriately selected as necessary. A combination of the guide 32 and positioning structural part 50 may be omitted.

Next, a display device 100A in another embodiment of the present disclosure will be described with reference to FIGS. 11A to 11H. FIGS. 11A to 11G are drawings related to the display device 100A, each of which is a cross-sectional view taken when a virtual XY plane crossing individual constituent elements is viewed from the +Y direction. Specifically, a way of assembling the display device 100A is illustrated in the order of FIGS. 11A to 11G. FIG. 11H illustrates a comparative example.

First, the worker places the display module 2 on the surface of a flat workbench so that the front surface (surface on the +Z side) of the display module 2 faces downward, as illustrated in FIG. 11A. In this embodiment, the display module 2 includes the display panel 20 and back plate 21. A display driving circuit is integrated into the display panel 20. Each of the two tentative placement structural parts 21A is formed as a combination of a columnar protrusion 21AB and a truncated conical protrusion 21AT.

After that, the worker tentatively places the main circuit board 3 on the rear surface of the display module 2 so that notches 35 formed in the main circuit board 3 are aligned with the tentative placement structural parts 21A of the display module 2, as illustrated in FIG. 11B. In this embodiment, the notch 35 is formed as a through-hole passing through the main circuit board 3. The female screw 31F to be mated with the male screw 6M is formed at the center of the main circuit board 3 so as to pass through the main circuit board 3, without the use of a bracket or the like. In this case, the female screw 31F itself works as an engaging part. The main circuit board 3 comes in contact with the columnar protrusion 21AB and is supported by it; the main circuit board 3 does not come into contact with the truncated conical protrusion 21AT.

Then, the worker mutually connects the display driving circuit and main circuit board 3 with the flexible wiring member 4, as illustrated in FIG. 11C. On the plane on which the main circuit board 3 is currently positioned, its translational movement and rotation are restricted by the tentative placement structural parts 21A. Therefore, even if a force with which the main circuit board 3 would otherwise be translationally moved or rotated is applied through the flexible wiring member 4, the main circuit board 3 can maintain its orientation. In addition, even if a force with which the main circuit board 3 would otherwise be raised in the −Z direction, the main circuit board 3 can maintain its orientation. Therefore, unless the main circuit board 3 is raised beyond the height of the truncated conical protrusion 21AT, the main circuit board 3 returns to its previous position when the force disappears.

Then, the worker attaches the rear cover 5 to the rear surface (surface on the −Z side) of the display module 2, as illustrated in FIG. 11D. The through-hole 5H in the rear cover 5 has been positioned so as to be mated with the female screw 31F formed in the main circuit board 3.

Then, the worker inserts the male screw 6M into the through-hole 5H in the rear cover 5 and engages the male screw 6M with the female screw 31F, as illustrated in FIG. 11E.

Then, the worker turns the male screw 6M by using a Phillips screwdriver or the like to draw the main circuit board 3 toward the inner wall of the rear cover 5, as illustrated in FIG. 11F. As the male screw 6M is turned, the main circuit board 3 comes close to the inner wall of the rear cover 5.

Then, the worker further turns the male screw 6M to bring the main circuit board 3 into contact with the inner wall of the rear cover 5 and fasten the main circuit board 3 as illustrated in FIG. 11G. When the main circuit board 3 is fastened to the inner wall of the rear cover 5, the main circuit board 3 is reliably grounded. Even in this state, the rear surface (surface on the +Z side) of the main circuit board 3 is at a position lower than the height of the truncated conical protrusion 21AT of the tentative placement structural part 21A. Therefore, the tentative placement structural part 21A can restrict the movement of the main circuit board 3 with respect to the display module 2 in the X-axis direction and Y-axis direction until the main circuit board 3 is fastened to the inner wall of the rear cover 5. However, when the main circuit board 3 has been fastened to the inner wall of the rear cover 5, the rear surface (surface on the +Z side) of the main circuit board 3 may be at a position higher than the height of the truncated conical protrusion 21AT.

As described above, with the display devices 100 and 100A, the main circuit board 3 is not fixed to display module 2, but is fixed to the rear cover 5. Therefore, it is possible to prevent the main circuit board 3 from applying an unnecessary force to the display module 2.

If the main circuit board 3 is fixed to a display module 2X as illustrated in, for example, a comparative example in FIG. 11H, the main circuit board 3 may apply an unnecessary force to the display module 2X. Specifically, the display module 2X in FIG. 11H has the display panel 20 and a back plate 21X. The back plate 21X has two elastic fixing members 21AX corresponding to the two notches 35 in the main circuit board 3. A difference between an outer width W5 between the two elastic fixing members 21AX and an outer width W6 between the two notches 35 is used to fix the main circuit board 3 to the back plate 21X. In this example, the outer width W5 is slightly larger than the outer width W6. With this structure, when fixed to the back plate 21X, the main circuit board 3 tends to warp the display panel 20 and back plate 21X as indicated by the dashed lines in FIG. 11H. This trend is maximized when tolerance is at the worst level. In this case, the display panel 20 causes variations in brightness, Black Mura, and other failures.

By contrast, with the display devices 100 and 100A, the main circuit board 3 is fixed to the rear cover 5. Therefore, the main circuit board 3 does not apply an unnecessary force to the display module 2. As a result, it is possible to prevent the display panel 20 from being distorted or warped, for example, and thereby possible to prevent the display panel 20 from causing variations in brightness, Black Mura, and other failures.

As described above, the display devices 100 and 100A have the operational member 6 that passes through the rear cover 5 and engages the main circuit board 3. The worker operates the operational member 6 from the same side as the rear surface (surface on the −Z side) of the rear cover 5 with the main circuit board 3 placed between the display module 2 and the rear cover 5. The operational member 6 does not fix the main circuit board 3 to the display module 2, but fixes the main circuit board 3 to the rear cover 5. The main circuit board 3 is fixed to the rear cover 5 in a state in which the main circuit board 3 is not fixed to the display module 2 or is not in contact with it. Therefore, the main circuit board 3 does not apply an unnecessary force to the display module 2. With this structure, the display devices 100 and 100A can further reduce a force applied to the display panel 20 by the main circuit board 3. As a result, it is possible to prevent the display panel 20 from being distorted or warped, for example, and thereby possible to prevent the display panel 20 from causing variations in brightness, Black Mura, and other failures.

The display devices 100 and 100A preferably have the tentative placement structural parts 21A on the rear surface of the display module 2. The tentative placement structural parts 21A restrict the movement of the main circuit board 3 with respect to the display module 2. With this structure, the display devices 100 and 100A can prevent the main circuit board 3 from moving when, for example, the display driving circuit 22 and main circuit board 3 are mutually connected with the flexible wiring member 4. Therefore, the display devices 100 and 100A can be assembled with improved workability. If the main circuit board 3 moves, it may become difficult to mutually connect the display driving circuit 22 and main circuit board 3 with the flexible wiring member 4. In addition, the length of the flexible wiring member 4 can be shortened. This is because the main circuit board 3 does not move and a distance between the display driving circuit 22 and the main circuit board 3 thereby remains unchanged. If the display module 2 and main circuit board 3 are to be mutually connected without the main circuit board 3 being tentatively placed on the rear surface of the display module 2 in a state in which, for example, the main circuit board 3 is placed apart from the display module 2, the flexible wiring member 4 needs to be relatively long. To store the long flexible wiring member 4 in the internal space, the long flexible wiring member 4 needs to be appropriately folded and a relatively large storage space is required. The display devices 100 and 100A can eliminate these requirements.

The operational member 6 is preferably structured so as to extend in the direction in which the interface 30 passes through the rear cover 5 and extends. That is, the operational member 6 is structured so that the direction in which the operational member 6 moves the main circuit board 3 matches the direction in which the interface 30 extends. With this structure, the size of the through-hole 5T in the rear cover 5 can be minimized. This can be achieved because the size, of the through-hole 5T, necessary to pass the interface 30 remains unchanged when the operational member 6 draws the main circuit board 3 to the rear cover 5. However, the present disclosure is not limited to this structure. The direction in which the operational member 6 moves the main circuit board 3 may differ from the direction in which the interface 30 extends. For example, the direction in which the operational member 6 moves the main circuit board 3 may be a direction that extends from the front surface (surface on the −Z side) of the main circuit board 3 at an angle or a direction that extends in parallel to the front surface (surface on the −Z side) of the main circuit board 3.

The operational member 6 is preferably the female screw 31F formed in the bracket 31 attached to the main circuit board 3 or the male screw 6M (fastening member such as a bolt) that engages the female screw 31F formed in the main circuit board 3. With this structure, the main circuit board 3 is quickly fastened to and fixed to the rear cover 5 easily. However, the present disclosure is not limited to this structure. For example, the operational member 6 may be a nut. In this case, a male screw that passes through the through-hole 5H in the rear cover 5 is permanently attached to the main circuit board 3. If the operational member 6 is such that the worker can manipulate it outside the rear cover 5, the operational member 6 may be another member that can implement a fixing mechanism in cooperation with an engagement part formed on or attached to the main circuit board 3. The fixing mechanism brings the main circuit board 3 close to the rear cover 5 and fastens the main circuit board 3. The fixing mechanism is formed from various mechanical elements such as screws, cams, gears, levers, springs, and link mechanisms.

The display devices 100 and 100A preferably have the positioning structural part 50 on the inner wall surface (surface on the +Z side) of the rear cover 5. The positioning structural part 50 restricts the movement of the main circuit board 3 with respect to the rear cover 5. For example, when the operational member 6 draws the main circuit board 3 toward the rear cover 5, the positioning structural part 50 restricts the translational movement and rotation of the main circuit board 3 on a plane parallel to the XY plane. With this structure, when the operational member 6 draws the main circuit board 3 toward the rear cover 5, the positioning structural part 50 can prevent the main circuit board 3 from changing its orientation.

Preferred embodiments of the present disclosure have been described above in detail. However, the present disclosure is not limited to the embodiments described above. Various modifications and replacements can be added to the embodiments described above without departing from the scope of the present disclosure.

For example, although the main circuit board 3 is fastened to and fixed to the rear cover 5 with a single male screw 6M, this is not a limitation. For example, two or more male screws 6M may be used to fasten and fix the main circuit board 3 to the rear cover 5.

What is claimed is:

1. A display device comprising:
a display module;
a cover that covers a rear surface of the display module;
a main circuit board placed in an internal space formed between the cover and the rear surface of the display module;
a flexible wiring member that mutually connects the display module and the main circuit board;
an operational member having an operational part exposed to an outside of the cover, the operational member passing through the cover and engaging an engagement part provided at the main circuit board; and
a tentative placement structural part disposed on the rear surface of the display module;
wherein the main circuit board is fixed to the cover by the operational member in a state in which the main circuit board is not fixed to the display module; and
wherein the tentative placement structural part restricts movement of the main circuit board with respect to the display module in directions other than a direction in which the main circuit board moves toward the cover.

2. The display device according to claim 1, wherein:
the main circuit board has an interface that passes through the cover and extends; and
the operational member extends in a direction in which the interface extends.

3. The display device according to claim 1, wherein the operational member is a male screw that engages a female screw formed in the main circuit board.

4. The display device according to claim 1, further comprising a positioning structural part disposed on an inner wall of the cover,
wherein the positioning structural part restricts movement of the main circuit board with respect to the cover in directions other than a direction in which the main circuit board moves toward the cover.

5. A method of assembling a display device that includes
a display module,
a cover that covers a rear surface of the display module,
a main circuit board placed in an internal space formed between the cover and the rear surface of the display module,
a flexible wiring member that mutually connects the display module and the main circuit board,
an operational member having an operational part exposed to an outside of the cover, the operational member passing through the cover and engaging an engagement part provided at the main circuit board, and
a tentative placement structural part disposed on the rear surface of the display module;
the method comprising the steps of:
tentatively placing the main circuit board on the rear surface of the display module;
mutually connecting the display module and the main circuit board with the flexible wiring member;
attaching the cover to the rear surface of the display module; and
operating the operational part from the outside of the cover to draw the main circuit board toward the cover and fix the main circuit board with the operational member; and
restricting movement of the main circuit board with respect to the display module, using the tentative placement structural part, in directions other than a direction in which the main circuit board moves toward the cover.

* * * * *